US006531681B1

(12) United States Patent
Markle et al.

(10) Patent No.: US 6,531,681 B1
(45) Date of Patent: Mar. 11, 2003

(54) APPARATUS HAVING LINE SOURCE OF RADIANT ENERGY FOR EXPOSING A SUBSTRATE

(75) Inventors: David A. Markle, Saratoga, CA (US); Andrew M. Hawryluk, Los Altos Hills, CA (US); Hwan J. Jeong, Los Altos, CA (US)

(73) Assignee: Ultratech Stepper, Inc., San Jose, CA (US)

(*) Notice: Subject to any disclaimer, the term of this patent is extended or adjusted under 35 U.S.C. 154(b) by 0 days.

(21) Appl. No.: 09/536,869

(22) Filed: Mar. 27, 2000

(51) Int. Cl.[7] .............................................. B23K 26/06
(52) U.S. Cl. ............................. 219/121.8; 219/121.73; 219/121.74; 700/166
(58) Field of Search ................ 219/121.73, 121.75, 219/121.65, 121.66, 121.74, 121.8; 700/166

(56) References Cited

U.S. PATENT DOCUMENTS

| 4,826,269 A | * | 5/1989 | Streifer et al. |
| 4,978,974 A | * | 12/1990 | Etzel |
| 5,463,534 A | * | 10/1995 | Raven |
| 5,699,180 A | * | 12/1997 | Urakawa et al. |
| 5,802,856 A | * | 9/1998 | Schaper et al. |
| 5,891,764 A | * | 4/1999 | Ishihara et al. |
| 6,117,752 A | * | 9/2000 | Suzuki |
| 6,331,692 B1 | * | 12/2001 | Krause et al. ......... 219/121.73 |

FOREIGN PATENT DOCUMENTS

| JP | 2-80185 A | * | 3/1990 |
| JP | 2000-40243 A | * | 2/2000 |

\* cited by examiner

Primary Examiner—Geoffrey S. Evans
(74) Attorney, Agent, or Firm—Allston L. Jones

(57) ABSTRACT

Radiant energy line source(s) (e.g., laser diode array) and anamorphic relay receiving radiant energy therefrom and directing that energy to a substrate in a relatively uniform line image. The line image is scanned with respect to the substrate for treatment thereof. Good uniformity is provided even when the line source is uneven. Optionally, delimiting aperture(s) located in the anamorphic relay focal plane and a subsequent imaging relay are includeable to permit substrate exposure in strips with boundaries between adjacent strips within scribe lines between circuits. An anamorphic relay focal plane mask with a predetermined pattern can be used to define portions of the substrate to be treated with the substrate and mask scanning motions synchronized with each other. Control of source output, and position/speed of the substrate, with respect to the line image, allows uniform dose and required magnitude over the substrate.

27 Claims, 13 Drawing Sheets

APPARATUS HAVING LINE SOURCE OF RADIANT ENERGY FOR EXPOSING A SUBSTRATE

BACKGROUND OF THE INVENTION

1. Field of the Invention

This invention is directed to an apparatus and method that generates radiant energy for use in processing a substrate and/or integrated devices or circuits formed thereon. For example, the apparatus and method can be used to supply radiant energy to anneal and/or activate dopants of source, drain or gate regions of integrated devices or circuits, to form silicide regions in integrated devices or circuits to lower contact resistances of metal wiring coupled thereto, or to trigger a chemical reaction to either form or remove substances from a substrate. The invented apparatus and method can also be used to generate, pattern, and direct radiant energy to a substrate for selective treatment thereof.

2. Description of the Related Art

Various devices for laser treatment of semiconductor substrates have been known and used in the integrated circuit fabrication industry. Laser annealing is preferably done in a single cycle that brings the temperature of the material to be annealed up to the annealing temperature and back down in a single cycle. If a pulsed laser is used, this requires enough energy per pulse to bring the entire chip or circuit up to the annealing temperature. Because the required field size can exceed four (4) centimeters-squared ($cm^2$) and the required dose can exceed one (1.0) Joules/$cm^2$, a relatively large, expensive laser is required. It is also difficult to achieve good dose uniformity over a relatively large area in a single pulse because the narrow spectral range of most lasers produces a speckled pattern due to interference effects.

An alternative approach is to use a continuous laser, which illuminates a relatively narrow line spanning the width of a chip or group of chips on a substrate, and to continuously scan the illuminated line image over the substrate. Although the relative complexity and expense of a laser apparatus using this approach can be greatly reduced relative to single-pulse laser systems, there is still considerable room for improvement of the image intensity and quality, as well as for reduction in the complexity and cost of such line-scanning apparatuses. It would be desirable to provide a line-scanning apparatus that generates a relatively high-intensity line image for treating integrated devices formed on a semiconductor substrate. It would further be beneficial to provide an apparatus with a configuration that is greatly simplified, and less expensive, as compared to previous devices and that provides superior uniformity of radiant energy along the length of the line image relative to previous devices and techniques.

SUMMARY OF THE INVENTION

It is an object of the invention to provide an apparatus that generates relatively intense radiant energy for processing a substrate.

It is an object of the invention to provide an apparatus that can be used to expose a relatively large rectangular area or strip across a substrate.

It is an object of the invention to provide an apparatus that can uniformly irradiate and process a substrate with radiant energy.

It is an object of the invention to provide an apparatus for processing a substrate with radiant energy that is relatively simple in construction and is readily manufactured.

The invented apparatus overcomes the above-stated disadvantages, and attains the above-stated objects and advantages. The invented apparatus includes at least one line source with one or more laser diodes. The laser diodes can be components of one or more laser diode array bars. Each laser diode array includes a plurality of laser diodes arranged at intervals along a linear emission face of the array. The source can be used to irradiate a relatively narrow line or strip image on a substrate. The substrate can be a semiconductor wafer, for example. Each laser diode array includes a plurality of laser diodes arranged at intervals along a linear emission face of the array. The apparatus also includes an anamorphic relay. The anamorphic relay receives and directs radiant energy from the line source to the substrate to form the line image thereon. The anamorphic relay can be configured so that each point along the length of the image generated by such relay is illuminated by radiant energy from more than one, and optionally many or all, laser diodes of the apparatus. Accordingly, the intensity of the line image at each point thereof is relatively uniform even though the radiant energy generated by each laser diode may vary, because the intensity at each such point in the image is the average of that radiant energy generated by more than one laser diode. The line image is therefore relatively invariant to fluctuations in the radiant energy generated by any one laser diode.

The apparatus can further include a controller, a power supply, a stage, a stage controller, an input unit, a display unit, and a radiant energy detector. A user can manipulate the input unit to generate one or more signals indicative of predetermined processing parameters including dose of radiant energy, intensity of radiant energy, scan speed, and/or number of scans to process the substrate. The input unit is coupled to supply the parameter signals to the controller. The controller can be coupled to receive a start signal generated by a user's manipulation of the input unit. Alternatively, the start signal and operating mode can be generated externally from the apparatus, for example, by a master controller of an assembly of machines for a production line in which the apparatus is a part. In response to the start signal that initiates the apparatus' operation mode, the controller generates and supplies an intensity control signal to the power supply, which generates a regulated electric current based thereon. The line source receives the current, and generates radiant energy based on such current. From the line source, the radiant energy travels to the substrate via the anamorphic relay to form the line image thereon. Also in response to the start signal, the controller generates a scan control signal based on the parameter signals indicating the predetermined dose and scan speed, optionally also the number of scans to be performed to process the substrate. The controller is coupled to supply the scan control signals to the stage controller. Based on the scan control signal, the stage controller generates a scan signal. The stage controller is coupled to supply the scan signal to the stage on which the substrate is situated, to position the substrate relative to the anamorphic relay and line source. The detector is used in the apparatus' preparation mode. The detector is positioned on the stage, and receives radiant energy generated by the line source. The detector generates a detector signal indicative of the radiant energy received by the substrate. The detector is coupled to the controller that integrates the detector signal to produce a signal indicative of the radiant energy dose received by the detector. Generally, the detector is used in the apparatus' calibration mode to adjust the line image intensity and/or the scan speed to deliver a predetermined dose of radiant energy to the substrate.

A method in accordance with the invention includes generating radiant energy with a plurality of laser diodes, and anamorphically focusing the radiant energy to a substrate to form a line image to process the substrate. The invented method achieves similar advantages as previously described with respect to the apparatus.

These together with other features and advantages, which will become subsequently apparent, reside in the details of the invented apparatus and method as more fully hereinafter described and claimed, reference being made to the accompanying drawings, forming a part hereof wherein like numerals refer to like parts throughout the several views.

DESCRIPTION OF THE PREFERRED EMBODIMENTS

As used herein, the following terms have the following meanings:

"Anneal" includes "activation", "crystallization" or "recrystalization" within its scope, and refers to raising and subsequently lowering the temperature of a semiconductor region either to crystallize the amorphous semiconductor region to be integral with a crystalline semiconductor substrate, or to activate dopants by incorporating them into the crystalline lattice of the semiconductor region.

"Line source" refers to a source of radiant energy that emits such radiant energy from a relatively long, narrow emission face. The line source can be a laser diode array bar with diodes positioned at spaced positions along a linear or length axis of the array bar.

"Line image" refers to a rectangular strip irradiated by radiant energy that is the image of the line source(s).

"Process" as used herein is broadly defined and includes the use of the line image formed by the disclosed apparatus and method to treat the substrate such as by annealing source, drain, or gate regions of an integrated circuit or device, to form silicide regions in integrated devices or circuits to lower contact resistances of metal wiring coupled thereto, or to trigger a chemical reaction to either form or remove substances from a substrate. Such term also includes forming an image of a pattern on a mask onto a substrate to pattern a resist layer, for example.

"Radiant energy" refers to photons such as can be generated by a line source including one or more laser diode array bars, for example.

1. Preferred Embodiments of the Invented Apparatus

Figure 1:
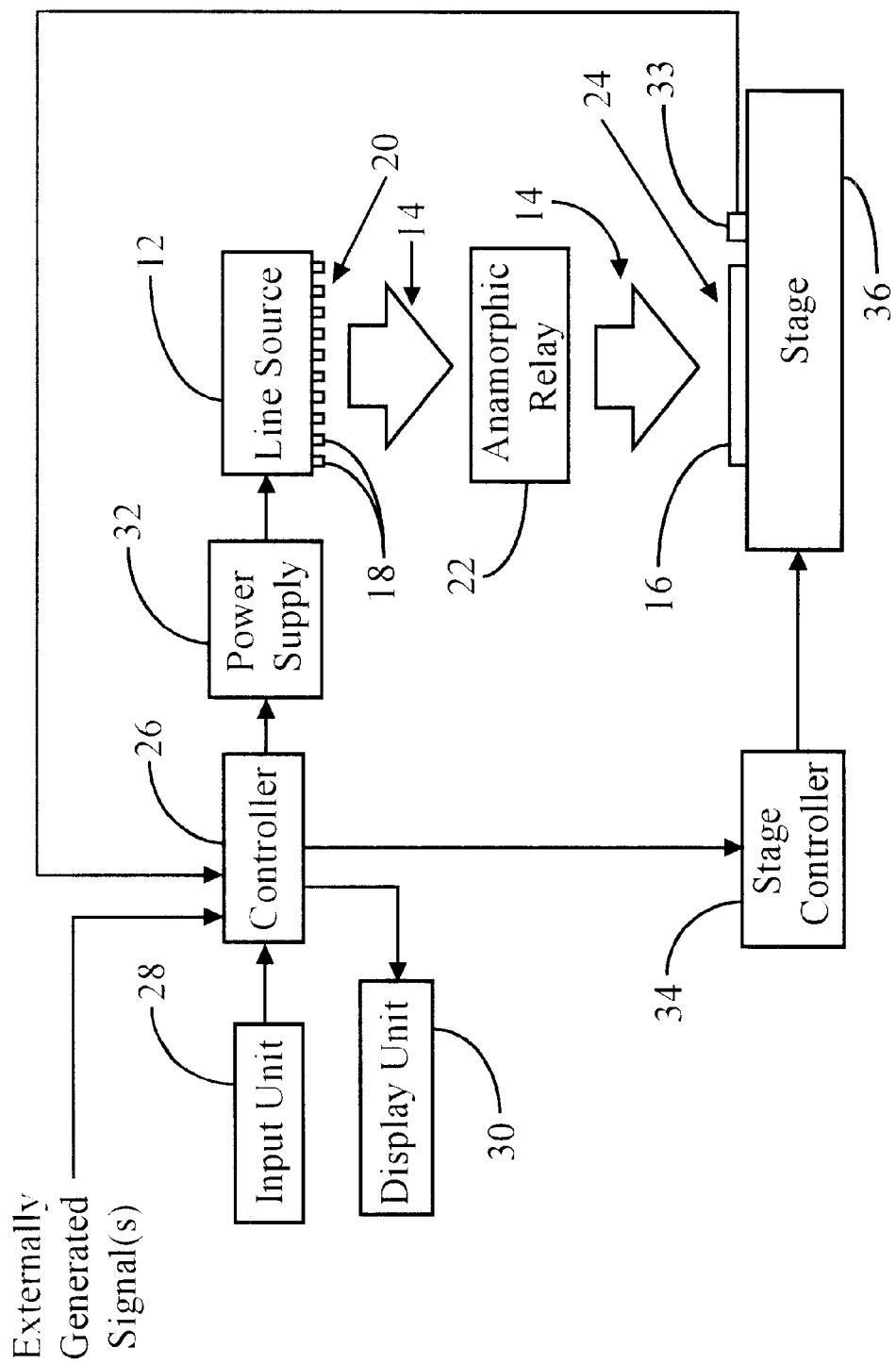
FIG. 1 is a block diagram of the invented apparatus.

In FIG. 1, a first embodiment of an apparatus 10 in accordance with this invention is shown. The apparatus 10 includes a line source 12 that generates relatively intense radiant energy 14 used for treatment of a substrate 16. The line source 12 includes one or more laser diode arrays each having a plurality of laser diodes 18 positioned at regular spaced intervals along a linear emission face 20 thereof. The laser diodes 18 are relatively closely-spaced and positioned at intervals along a linear direction defining the axis of the laser diode array. The line source 12 can generate radiant energy 14 at a wavelength from about 350 nanometers (nm) to 950 nm. Such wavelength range is particularly effective for processing the substrate 16 if such substrate is composed of silicon and the integrated device or circuit features are on the order of one micron or less with source/drain regions of a few. tens of nanometers (nm). in thickness. However, the invented apparatus is not limited to a line source 12 that generates radiant energy only within the above-stated wavelength range or integrated device features. At present, commercially-available laser diode array bars include units that emit radiant energy at wavelengths extending from 380 nm (GaN blue diodes) through 931 nm. The wavelengths and types of laser diode arrays commercially-available on the market has rapidly expanded, and this trend will likely continue so that numerous additional arrays both within and without the above-stated wavelength range are expected to become available from manufacturers in the future. Many of such future laser diode arrays may be useful for implementation in the subject apparatus. Some commercially-available laser diode array bars are capable of generating the radiant energy 14, with a power from fifty (50) to one-hundred (100) Watts in a 1 cm long bar, which is relatively intense. In a typical configuration, the laser diode array bar is about one (1) centimeter along the largest dimension of the emission face 20, and includes twenty-four evenly-spaced laser diodes per centimeter or per bar unit along this dimension. A plurality of such bar units can be joined together so that the emission face 20 of the line source 12 can be readily extended to a predetermined length sufficient to irradiate a predetermined linear area of the substrate. The emission area of each laser diode 18 is about one (1) micron by one-hundred (100) microns. The laser diodes 18 typically emit radiant energy that is divergent at 10° in a plane containing the axis of the array along which the laser diodes are arranged, and is divergent at 30° in a plane orthogonal to the axis of the laser diode array. Suitable laser diode array bars are commercially-available from numerous suppliers, including SDL, 80 Rose Orchard Way, San Jose, Calif. 95134-1365 (e.g., the SDL 3400 series includes linear arrays one centimeter long and capable of 40 Watts output power), Star Technologies, Inc. of Pleasanton, Calif., Spire, Inc. of One Patriots Park, Bedford, Mass. 01730-2396, Siemens Microelectronics, Inc., Optoelectronics Division, of Cupertino, Calif. (Model SPL BG81), Spectra Diode Labs, and Thompson CFS of 7 Rue du Bois Chaland, CE2901 Lisses, 91029 Evry Cedex, France, IMC, 20 Point West Boulevard, St. Charles, Mo. 63301. Because the heat generated by the laser diodes 18 can be substantial, these laser diode array bars typically have built-in water-cooling units to prevent their overheating during use.

The apparatus 10 also includes an anamorphic relay 22. The anamorphic relay 22 is preferably configured so that each point along the image 24 receives radiant energy from more than one laser diode 18, and most preferably, from all laser diodes in the array. This feature improves the intensity uniformity of the image 24 at the substrate 16. The anamorphic relay 22 includes one or more mirrors, lenses, apertures, and/or other optical elements to condition and focus the radiant energy from the line source as the image 24 on the substrate 16. In order to utilize the laser diode array, a relatively compact anamorphic optical relay can be used to provide a close to diffraction-limited image of the array on a substrate in the direction normal to the linear direction along which the laser diodes 18 are arranged. In the direction parallel to the array, it is desirable that the output from each diode be smeared over the length of the image, so that if one or two diodes burn out, for example, the result is a lower overall intensity but relatively little or no change in the uniformity of radiant energy along the length of the image of the array. By providing a close to diffraction-limited image in one direction normal to the array axis it is possible to achieve a very high intensity that can readily heat materials such as silicon to their melting point. Having a wide, uniformly irradiated line image in the direction transverse to the array axis facilitates scanning and producing a uniform heat treatment across the substrate. The line source(s) 12 and anamorphic relay 22 can therefore be used. to generate a narrow-strip or line image of radiant energy 24 at the substrate 16. The image 24 can be used for blanket processing of a substrate, or to irradiate a substrate in a pattern defined by a mask for selective processing, for example.

The apparatus 10 can include a controller 26, an input unit 28, a display unit 30, a power supply 32, a stage. controller 34, a stage 36, and a detector 38. The controller 26 can be a microprocessor coupled to a memory, a microcontroller, programmable logic array (PLA), field-programmable logic array (FPLA), programmed array logic (PAL) or other control device.- The controller 26 is coupled to receive at least one parameter signal indicative of the predetermined dose of radiant energy to be supplied to process the substrate. The parameter signal(s) can also be indicative of the intensity, scan speed, and/or number of scans to be used to deliver a predetermined dose of radiant energy 14 to the substrate 16. The radiant energy dosage for processing the substrate 16 could be on the order of one (1) to five (5) Joules per square centimeter ($J/cm^2$), although such range is not given by way of limitation as other doses may be effective in some applications of the apparatus 10. The parameter signal(s) can be generated by the input unit 28 by manipulation thereof by a user. The input unit 28 is coupled to supply such parameter signal(s) to the controller 26. Based on the parameter signal(s) received from the input unit 28, the controller 26 can generate a display signal. The controller 26 is coupled to supply the display signal to the display unit 30 to generate a visual display from which the user can determine and verify the parameter signal level(s) set by the user via the input unit 28. Alternatively, the controller 26 can be coupled to receive parameter signal(s) generated externally to the apparatus, such as by a master controller in an assembly of substrate processing machines in which the apparatus is an element. The controller 26 is also coupled to receive a start signal that initiates processing performed by the apparatus 10. Such start signal can be generated by the input unit 28 or by an external unit such as a master controller.

In response to the start signal that initiates the apparatus' operation mode, the controller 26 is preprogrammed to generate an intensity control signal based on the parameter signal indicative of the predetermined intensity of the radiant energy as preset by the user or external controller. The controller 26 is coupled to supply the intensity control signal to the power supply 32. The power supply 32 is a commercially-available unit that can be obtained from a wide variety of suppliers. The power supply 32 generates a regulated current, based on the intensity control signal. More specifically, the amount of current in the signal output from the power supply is determined by the intensity control signal. The power supply 32 is coupled to supply current to the line source 12 that generates radiant energy with an intensity proportional to the amount of current.

In response to the start signal that initiates the apparatus' operation mode, the controller 26 is preprogrammed to generate a scan control signal based on the parameter signals indicative of the predetermined scan speed and number of scans. The controller 26 generates the scan control signal in coordination with the intensity control signal. The controller 26. is coupled to supply the scan control signal to the stage controller 34. The stage controller 34 is a unit that is widely available from numerous commercial sources. Based on the scan control signal and a predetermined scan pattern preprogrammed into the stage controller, the stage controller generates a scan signal to affect raster or serpentine scan patterns over the substrate, for example. The stage controller 34 is coupled to supply the scan signal to the stage 36, which moves the substrate 16 relative to the line source 12 and the anamorphic relay 22 to scan the image 24 over the substrate. In the apparatus' preparation mode prior to scanning in its operation mode, the stage 36 is aligned if necessary so that the substrate 16 is moved in the image plane so the edges of the scan fall on the scribe lines of the circuit. To assist in such alignment, the stage 36 can be a unit that translates the position of the substrate 16 along three orthogonal axes. The stage 36 is preferably also capable of rotating the substrate 16 about three rotational axes for additional degrees of freedom to assist in the alignment of the substrate 16 relative to the line source 12 and the relay 22.

The detector 38 generates a detector signal indicative of the radiant energy received at the substrate 16, based on radiant energy 14 from the line source 12 and the anamorphic relay 22. The detector 38 is coupled to supply the detection signal to the controller. In the apparatus' preparation mode, the controller 26 or user determines the relationship between levels of the intensity control signal and the scan speed, and the predetermined dose of radiant energy at the substrate 16. The radiant energy dose delivered to the substrate is approximately proportional to the radiant energy intensity divided by the scan speed. Hence, the controller 26 can be preprogrammed to integrate the detection signal to determine the radiant energy dose supplied to the substrate for predetermined levels of the intensity control signal and the scan control signal. The controller 36 can also use the detector signal in a feedback manner in the apparatus' operation mode to control the radiant energy generated by the line source 12 to ensure that the correct predetermined dose of radiant energy is delivered to the substrate 16.

Figure 2:
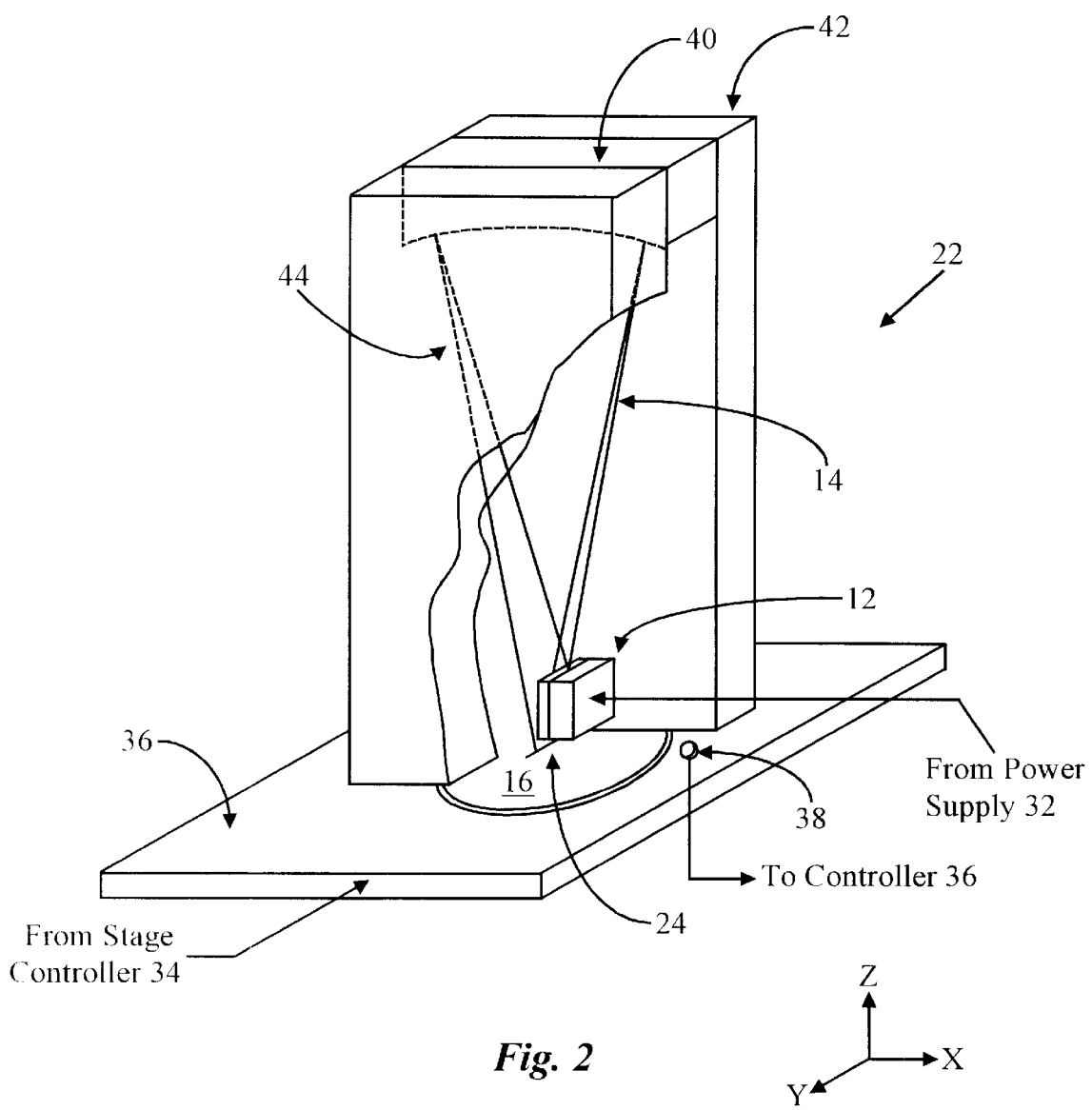
FIG. 2 is a partial cutaway perspective view of a first embodiment of the invented apparatus including a line source and an anamorphic, catoptric optical relay including a curved elliptical or circular mirror and two side wall mirrors.

FIG. 2 is a partial cutaway perspective view of a portion of the apparatus 10 shown in FIG. 1. In FIG. 2, the line source 12 is positioned relatively close to the substrate 16. Based on the current from power supply 32, the line source 12 generates radiant energy 14. The line source 12 is positioned to direct radiant energy 14 upwardly along the z-axis in FIG. 2. In FIG. 2, the anamorphic relay 22 includes a curved convergent mirror 40 with an elliptical or cylindrical reflective surface in cross-section in the x-z plane, that is extended along the y-axis direction. The relay 22 also includes side wall mirrors 42, 44 which have planar reflective surfaces opposing the line source 12. The spacing of the side wall mirrors 42, 44 defines the length of the anamorphic image 24 at the substrate 16. The mirror 40 receives the divergent radiant energy from the line source 12 and focuses the radiant energy to form an image 24 at the substrate 16. The side wall mirrors 42, 44 reflect light diverging in the y-axis direction in FIG. 2 to maintain such radiant energy between the mirrors 40, 42, 44. Preferably, the relay 22 extends sufficiently far along the optical path from the line source 12 so that the radiant energy distributions generated by different laser diodes 18 overlap in the y-axis direction in FIG. 2. Such overlap permits each point along the line image 24 of the substrate 16 to receive radiant energy from more than one, and preferably all, laser diodes. This feature enhances the intensity uniformity of the radiant energy applied to the substrate 16. The magnification of the optical relay 22 in the x-axis direction is not the same as that in the y-axis direction, i.e., the relay is anamorphic. More specifically, the mirror 40 converges and focuses radiant energy in the x-z plane normal to the line source 12 onto the substrate 16 to produce the image 24 on the substrate. However, the laser diode energy divergent in the y-z plane parallel to the array is not brought to focus because the cylindrical mirror has no power in this plane. Thus the radiant energy in the plane parallel to the line source's length axis diverges until it is reflected from one or the other of the plane mirrors 42, 44 placed on either side of the line source 12. Hence, the image 24 at the substrate 16 is the image of the line source 12 focused in the x-axis direction on the substrate 16 by the convergent mirror 40 and smeared or averaged in the orthogonal y-axis direction.

As with all mirrors disclosed herein, the reflective surfaces of the mirrors 40, 42, 44 can be composed of a metal such as aluminum that is reflective to the wavelength of the radiant energy 14. The reflective surfaces can be deposited on respective bases of rigid material such as glass or plastic, which can be on the order of one to five centimeters in thickness in largest dimension, for example. Such bases are configured to form the shapes of respective reflective mirror surfaces. Alternatively, the reflective surfaces can be composed of a mirror formed with a multilayer structure including layers with different refractive indices. Such mirrors can be made by numerous commercial sources, including Optical Coatings Laboratories, Inc. of Santa Rosa, Calif., upon specifying the dimensions of the curved convergent mirror and the wavelength to which the surface is to be reflective. The mirrors 40, 42, 44 and all other mirrors disclosed herein are formed to an accuracy sufficient so that the image 24 on the substrate 16 is at most about five microns wide along the shortest dimension thereof, i.e., along the x-axis in FIG. 2.

Figure 3:
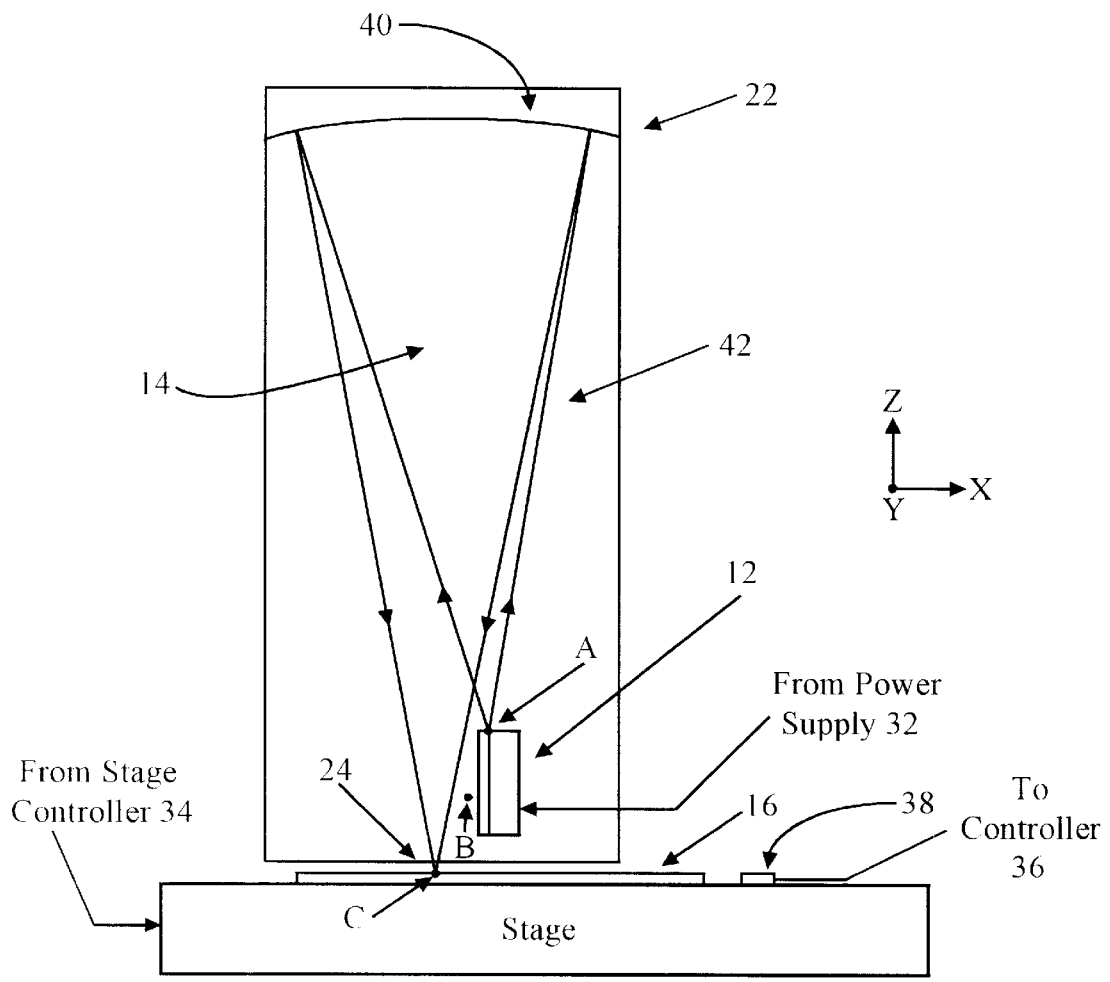
FIG. 3 is a cross-sectional view of the first embodiment of the invented apparatus.

FIG. 3 shows the portion of the apparatus 10 of FIG. 2 in cross-section. The cross-sectional view of FIG. 3 is taken along the x-z plane. As shown in FIG. 3, the reflective surface of the mirror 40 is configured with an elliptical reflective surface in the x-z plane with foci at point A at the line source's emission face and a point C at the image 24. The elliptical reflective surface is extended or projected along the y-axis direction to a distance equal to the image's length at the substrate 16. The reflective surface of the mirror 40 could alternatively be configured as a cylindrical surface with circular cross-section with a center at point B midway between the points A and C if resulting aberrations are tolerable in the line image 24 resulting therefrom.

Figure 4:
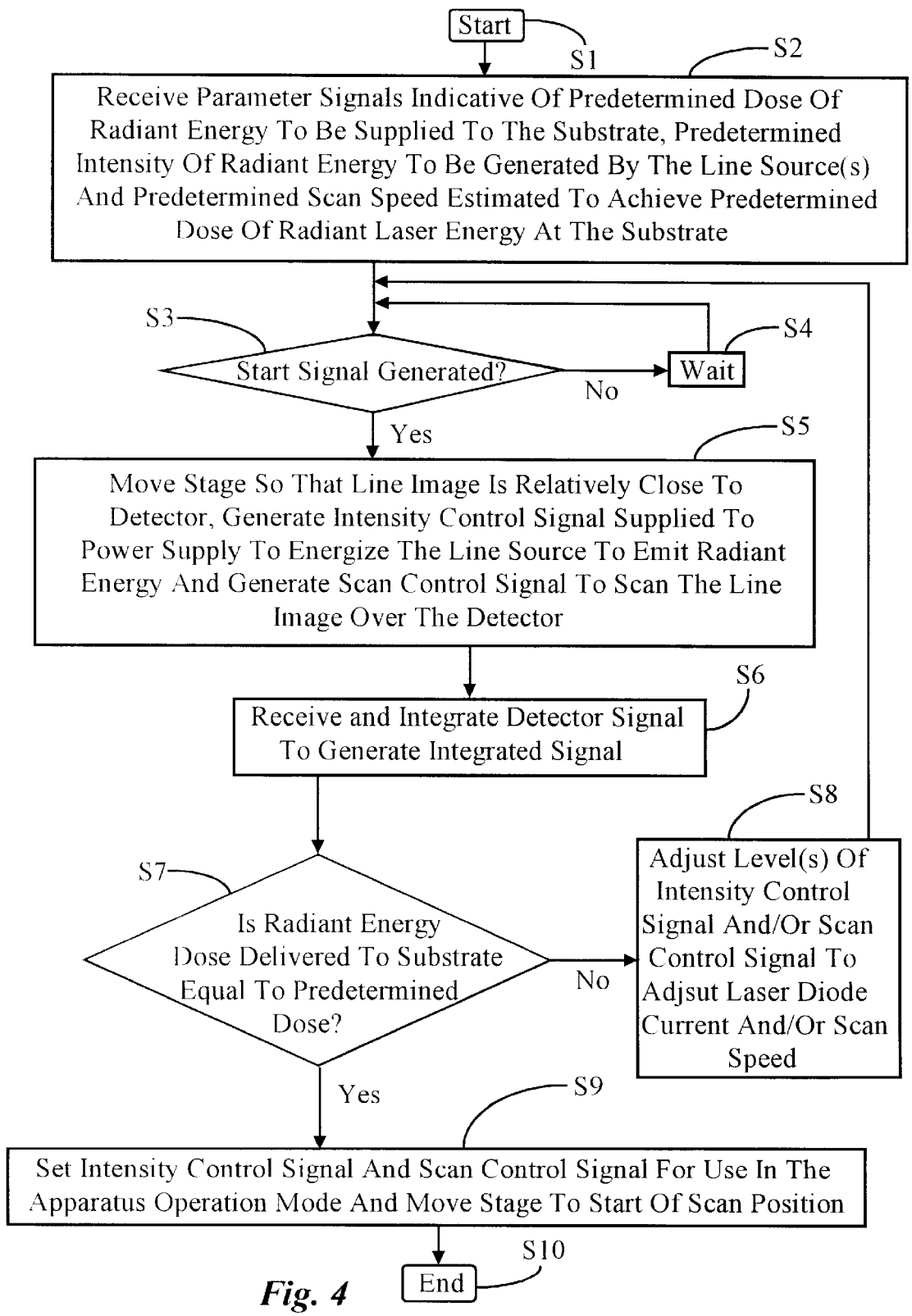
FIG. 4 is a flow chart of a method performed by the controller of the invented apparatus in its calibration mode.

In step S1 of FIG. 4, processing performed by the controller 26 in its preparation mode begins. In step S2, in the preparation mode of the apparatus, the controller 26 receives parameter signals indicative of the predetermined intensity dose of radiant energy to be generated by the apparatus to process the substrate, the intensity of radiant energy generated by the line source and the scan speed of the substrate relative to the line source(s) 12 and the relay 22. The user can input the parameter signal levels based on prior experience, trial-and-error or estimates as to how much radiant energy must be delivered to the substrate to achieve prespecified processing of the substrate. In step S3, the controller 26 determines whether the start signal has been generated. If not, in step S4, the controller 26 waits for a predetermined period of time such as one millisecond or less, and repeats performance of step S3. On the other hand, if the determination in step S3 is affirmative, in step S5, the controller 26 moves the stage so the detector 38 is close to the line source image and generates an intensity control signal supplied to the power supply 32 to energize the line source(s) 12 to emit radiant energy 14. The controller 26 also generates the scan control signal in coordination with generation of the intensity control signal, to scan the line image 24 over the detector 38. In step S6, the controller 26 receives and integrates the detector signal to generate an integrated signal representative of the dose of radiant energy received at the substrate. The controller 26 then, in step S7, compares the signal indicative of the radiant energy dose received by the detector with the parameter signal level indicative of the predetermined dose of radiant energy. If the two levels are not equal, in step S8, either the controller 26 or the user adjusts either or both of the intensity control signal to modify intensity of the radiant energy generated by the line source(s) and/or the scan control signal to modify the scan speed of the substrate relative to the line source(s) and relay, and the controller 26 repeats performance of step S3. The controller 26 can generate a display signal indicative of the radiant energy dose received by the detector at the substrate and supply such signal to the display unit to generate a visual display to assist the user in the adjusting the parameter signals for the next iteration of step 53 and subsequent processing. When step S9 is reached the correct values for the intensity control signal and the scan control signals have been established so these are fixed in preparation for scanning and the stage is moved to the start of scan position. In step 510, processing performed by the controller 26 in the apparatus' preparation mode ends.

Figure 5:
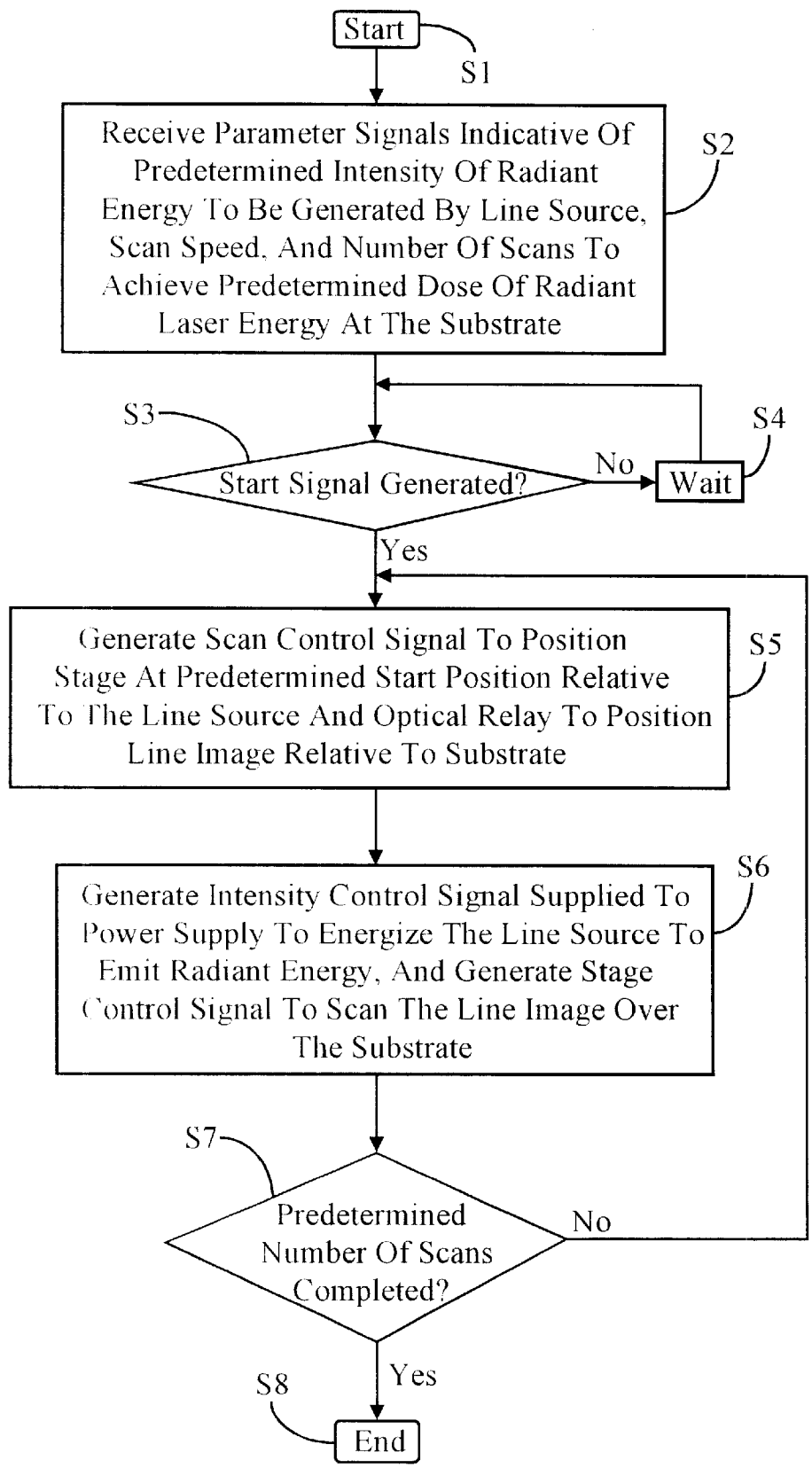
FIG. 5 is a flow chart of a method performed by the controller of the invented apparatus in its operation mode.

In FIG. 5, a flow chart of processing performed by the controller 26 in its operation mode is shown. In step S1, processing performed by the controller 26 begins. In step S2, the controller 26 receives the parameter signals indicative of the predetermined intensity of radiant energy to be generated by laser diode array(s), scan speed, and number of scans, to achieve a predetermined dose of radiant energy at the substrate 16. The predetermined radiant energy dose is of course sufficient to achieve processing of the substrate 16. The parameter signals for the radiant energy intensity and scan speed can be those determined by performance of the preparation mode. The number of scans is predetermined by the area of the substrate that is processed with radiant energy in one scan. In step 53, the controller 26 performs a determination to establish whether the start signal has been generated. If not, in step S4, the controller 26 waits for a predetermined period of time such as one millisecond or less, and again performs the determination of step S3. On the other hand, if the determination in step S3 is affirmative, in step S5, the controller 26 generates the scan control signal to position the stage at a predetermined start position relative to the line source 12 and the anamorphic relay 22. In step S6, the controller 26 generates an intensity control signal supplied to the power supply 32 to generate the current to energize the laser diode array(s) of the line source 12 to emit radiant energy 14. In addition, the controller 26 generates the scan control signal supplied to the stage controller 34 that generates the scan signal based thereon to cause the stage to execute the predetermined scan pattern at the predetermined scan speed. In step S7, the controller 26 determines whether the predetermined number of scans has been completed. If not, the controller 26 repeats step S5 and subsequent steps. On the other hand, if the predetermined number of scans has been completed, in step S8, processing performed by the controller 26 ends. The control scheme of FIG. 5 is basically a "step-and-scan" procedure. The processing of FIG. 5 can be repeatedly performed to process different wafer substrates 16 with radiant energy 14.

Figure 6:
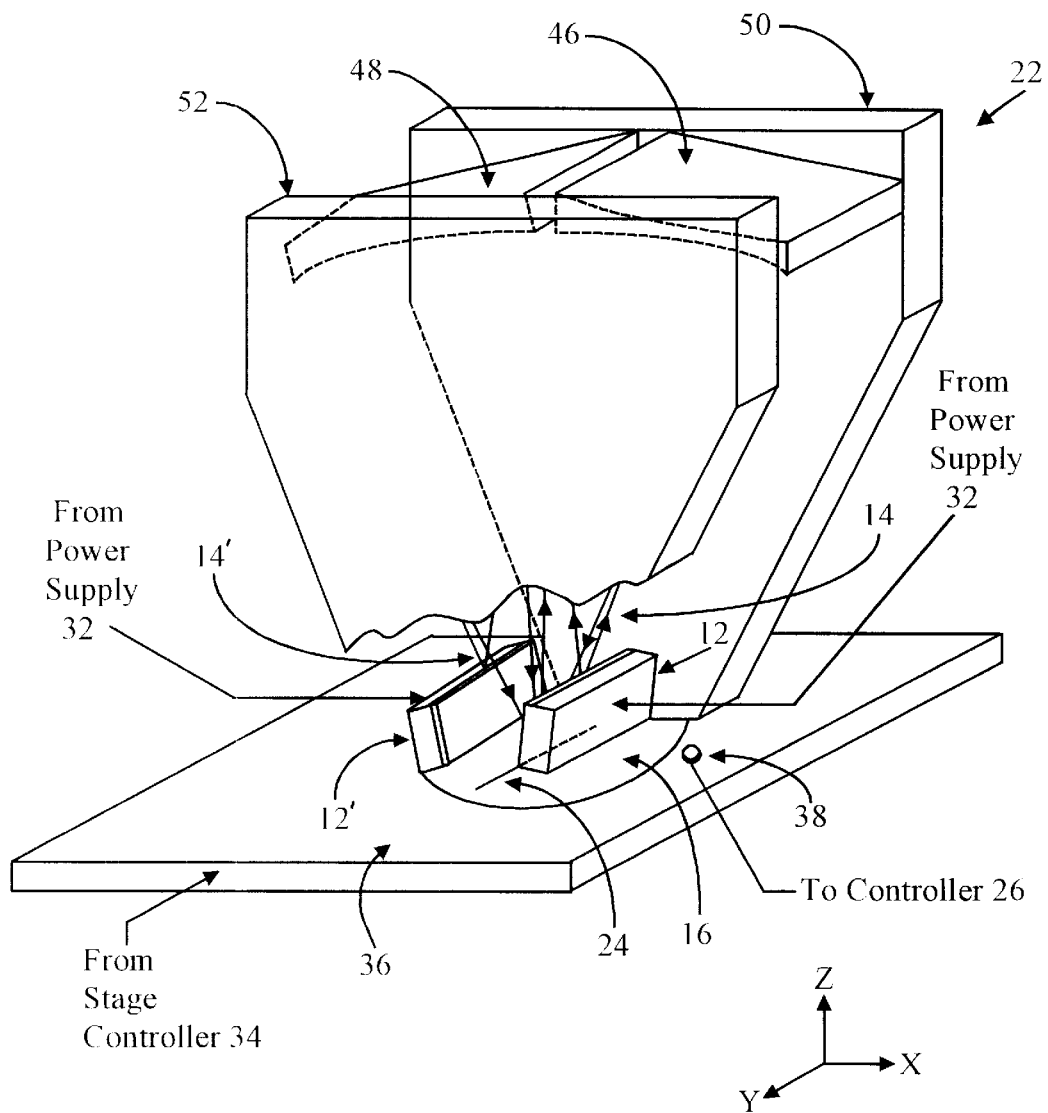
FIG. 6 is a partial cutaway perspective view of a second embodiment of the invented apparatus including two line sources and an anamorphic, catoptric optical relay with two curved elliptical or circular mirrors and two side wall mirrors.

In FIG. 6, a second embodiment of the apparatus 10 is shown. The apparatus 10 includes an additional line source 12' that can include laser diode array(s). Like the line source 12, the line source 12' is coupled to receive current from the power supply 32. Based on the current, the line source 12' generates radiant energy 14'. The relay 22 includes elliptical or spherical mirrors 46, 48, and planar side wall mirrors 50, 52. The line source 12 is arranged to direct radiant energy 14 to the mirror 46, which reflects such radiant energy to the line image 24. Similarly, the line source 12' is arranged to direct radiant energy 14' to the mirror 48, which also reflects such radiant energy to the line image 24. The relay 22 images the line sources 12, 12' to the same position or adjacent positions to form the line image 24. The side wall mirrors 50, 52 are positioned on opposite sides of the mirrors 46, 48 and are preferably spaced apart a distance equal to the length of the line image 24. The mirrors 50, 52 reflect radiant energy 14, 14' propagating in the y-axis direction in FIG. 6 as such radiant energy travels from the line sources to the substrate.

Figure 7:
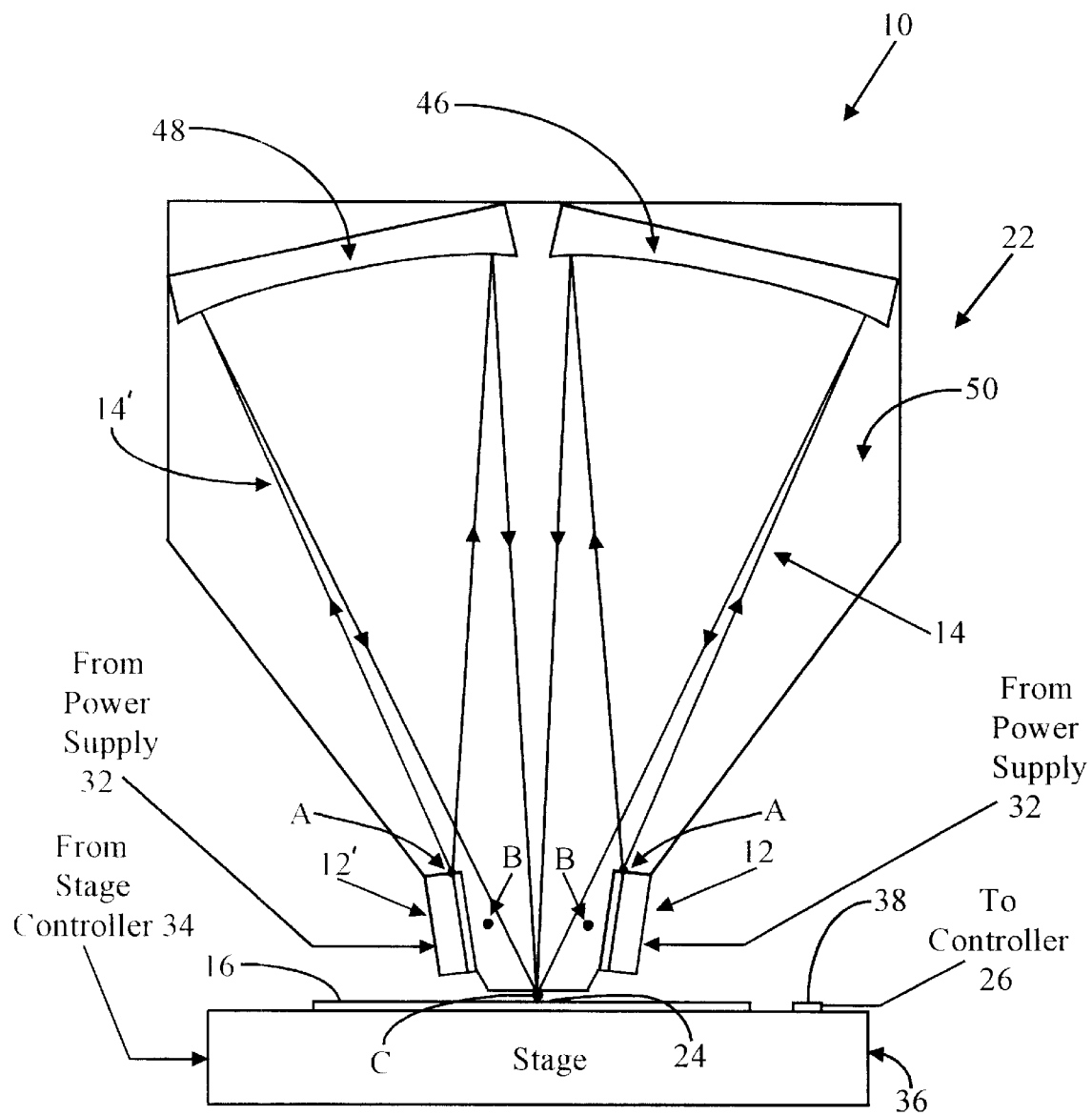
FIG. 7 is a cross-sectional view of the second embodiment of the invented apparatus.

FIG. 7 is a cross-sectional view of the apparatus embodiment of FIG. 6 taken along the x-z plane. The view of FIG. 7 is provided for greater appreciation of the features of the second embodiment of the invented apparatus.

Figure 8:
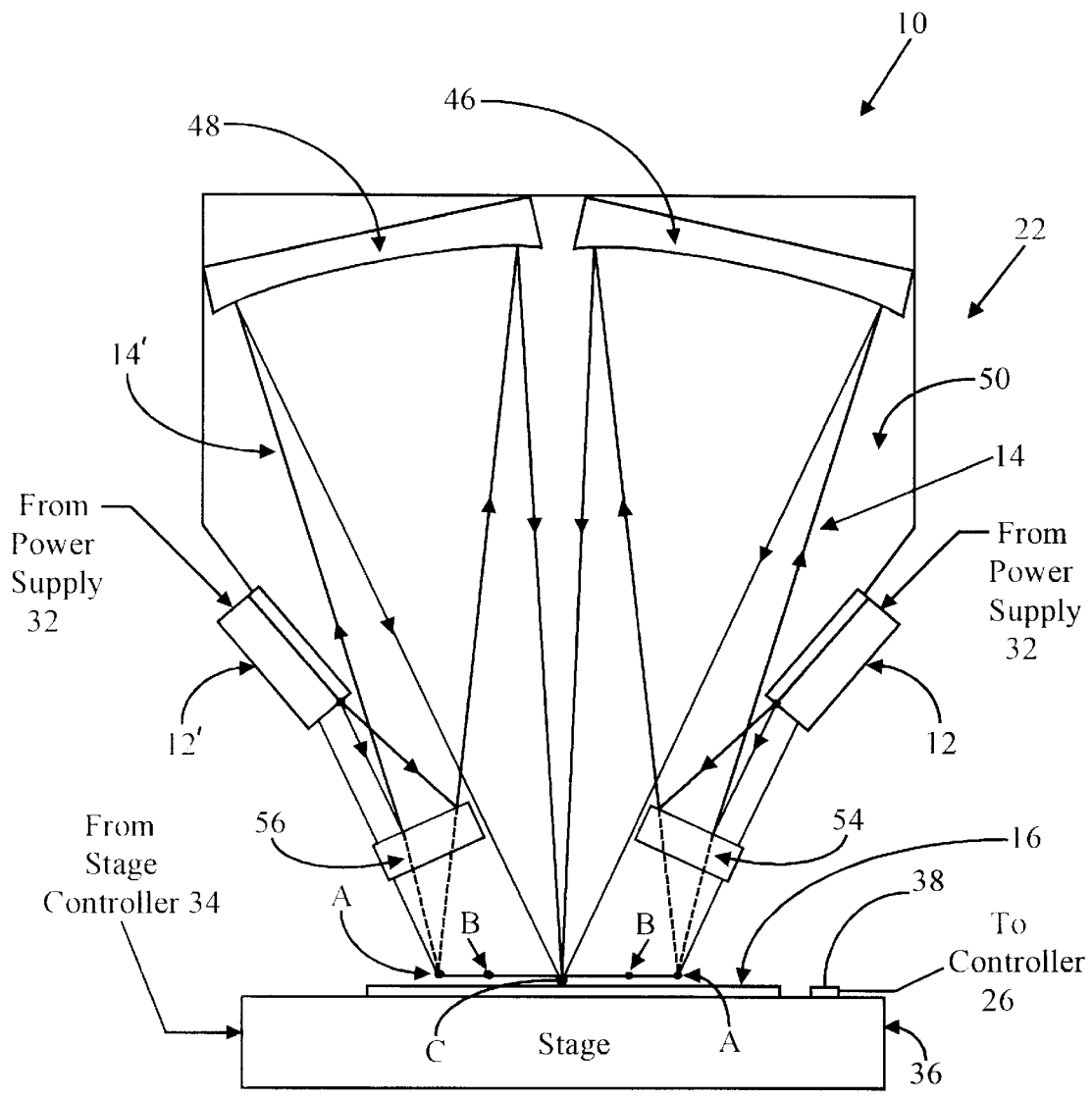
FIG. 8 is a cross-sectional view of a third embodiment of the invented apparatus including two line sources and an anamorphic, catoptric optical relay with fold mirrors, curved elliptical or circular mirrors, and side wall mirrors, to permit the line sources to be positioned relatively distant from the substrate.

In FIG. 8, the relay 22 includes planar fold mirrors 54, 56. The fold mirror 54 is positioned between the line source 12 and the mirror 46 along a first optical path traveled by the radiant energy 14. The fold mirror 56 is positioned between the line source 12' and the mirror 48 along a second optical path traveled by the radiant energy 14'. The fold mirrors 54, 56 can be used to position the line sources 12, 12' away from the substrate 16 and the stage 36 relative to the apparatus embodiments of FIGS. 2, 3, 6 and 7. By relocating the line sources 12, 12' relatively distant from the substrate 16 in this manner, enhanced clearance can be achieved between the line sources 12, 12', the substrate 16, and the stage 36.

Figure 9:
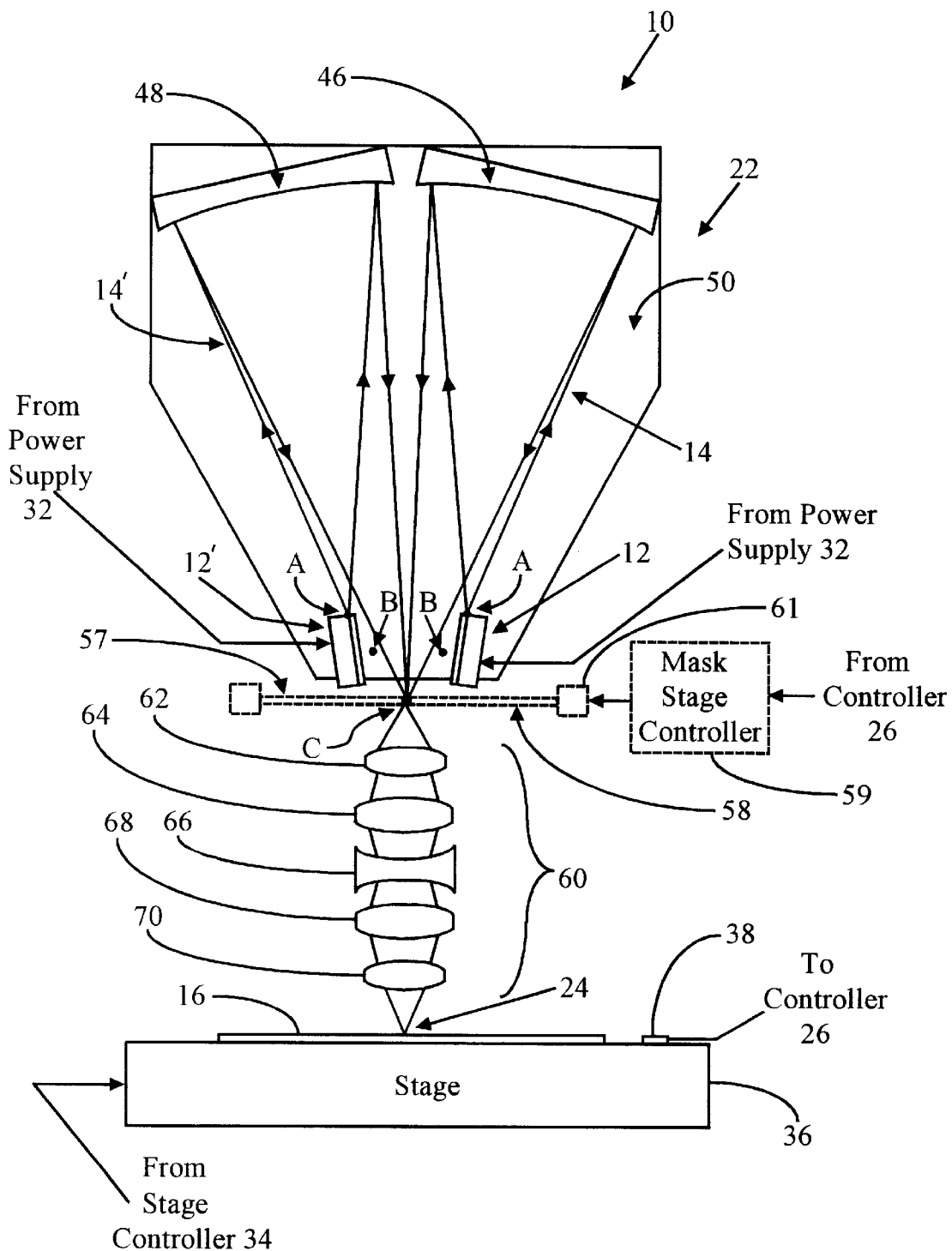
FIG. 9 is a cross-sectional view of a fourth embodiment of the invented apparatus including a catoptric, anamorphic relay including curved elliptical or circular mirrors, side wall mirrors, and a refractive image-relay to image radiant energy at the anamorphic relay focal plane to the substrate.

In FIG. 9, the relay 22 includes curved mirrors 46, 48, side wall mirrors 50, 52 (mirror 52 is not visible in FIG. 9), and a refractive imaging relay 60 including aligned lenses 62, 64, 66, 68, 70. The apparatus 10 further includes a variable aperture member 57. The variable aperture member 57 is aligned to the image plane of the relay 22. The variable aperture member 57 can be supported by the chassis or an additional stage 59 of the apparatus. The radiant energy 14, 14' generated by the line sources 12, 12' travels to and reflects from the mirrors 46, 48, possibly via side wall mirrors 50, 52, to the variable aperture member 57 where portions of the radiant energy are selectively blocked to delimit the radiant energy. The delimited reflected radiant energy 14, 14' travels from the variable aperture member 57 through the imaging relay 60 to form the image 24 on the substrate 16. In this embodiment, the line sources 12, 12' and the relay 22 are fixed to the chassis (not shown) in the relationship shown in FIG. 9. The embodiment of FIG. 9 can be used to restrict the thermal processing to a region contained between the scribe lines of a circuit.

FIGS. 2-9 are directed to embodiments of the apparatus 10 useful for treatment of the substrate 16 with radiant energy. For example, such treatment of the substrate with radiant energy can be performed to anneal and/or activate dopants of source, drain or gate regions of integrated devices or circuits, to form suicide regions in integrated devices or circuits to lower contact resistances of metal wiring coupled hereto, or to trigger a chemical reaction to either form or remove substances from the substrate 16. However, the apparatus 10 of FIG. 9 can be readily modified to perform a patterning application in which radiant energy 14, 14' is patterned by a mask 58. In this variation of the apparatus 10 of FIG. 9, the apparatus includes a mask stage controller 59 and a. mask stage 61 that are illustrated in broken line in FIG. 9 to indicate that such elements are optional. The mask stage controller 59 is coupled to receive a scan control signal from the controller 26 that, like the scan control signal supplied to the stage controller 34, is generated in response to the start signal. Based on the scan control signal generated by the controller 26, the mask stage controller 59 generates a scan signal supplied to the mask stage 61. Based on the scan signal generated by the mask stage controller 59, the mask stage 61 positions the mask 58 mounted therein. The scan control signal generated by the controller 26 is proportional to that supplied to the stage controller 34. For example, the relay 60 could be implemented with a magnification of −1X in which case the scan control signal causes the mask stage controller to control the mask stage 61 to move in opposite directions at the same rate of movement as the substrate 16 on the stage 36. The radiant energy 14, 14' can thus be scanned across the mask 58 and the substrate 16 to produce pattern radiant energy at the substrate 16. Of course, the controller 26 can control the relative movement of the mask 58 and substrate 16 to be at different rates depending upon the power of the imaging relay 60. For example, if the imaging relay 60 has a power of +12X, the controller 26 can control the mask stage controller 59, the mask stage 61, the stage controller 34, and the stage 36 to move in the same direction with the mask 58 moved at half the rate of movement of the substrate 16. The stage controller 34, the stage 36, the mask stage controller 59, and the mask stage 61 can be collectively referred to as "a scanning unit" in the appended claims because such elements move the mask 58 and substrate 16 in synchronization with one another.

Figure 10:
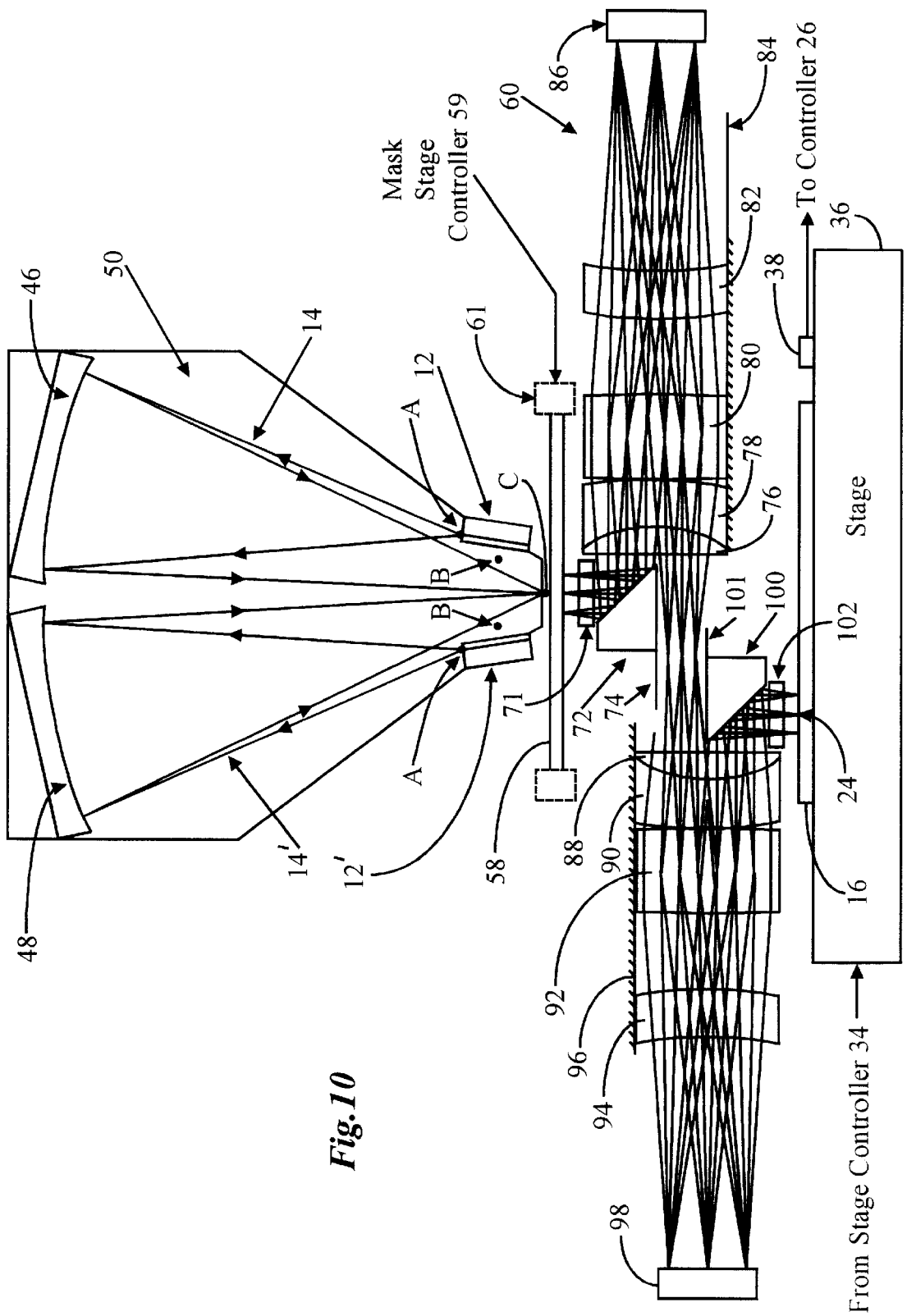
FIG. 10 is a cross-sectional view of a fifth embodiment of the invented apparatus including a catoptric anamorphic relay with curved elliptical or circular mirrors and side wall mirrors, and a catadioptric image relay for imaging radiant energy at the anamorphic relay focal plane to the substrate.

In FIG. 10, a fifth embodiment of the apparatus 10 is shown. The portion of the apparatus 10 of FIG. 10 is directed to a patterning application. The fifth embodiment of the apparatus 10 is similar to that of FIG. 9. In FIG. 10, however, the imaging relay 60 is a +1X catadioptric relay including window 71, fold mirror 72 mounted to surface 74 of the chassis (not entirely shown), lenses 76, 78, 80, 82 supported by surface 84 of the chassis, mirror 86, lenses 88, 90, 92, 94 supported by chassis surface 96, mirror 98, fold mirror 100 supported by chassis surface 101, and window 102. Radiant energy 14, 14' generated by respective line sources 12, 12' travels from such line sources to respective curved mirrors 46, 48 and is reflected. to the mask 58, possibly after reflection from side wall mirrors 50, 52. The radiant energy 14, 14' is patterned at the mask 58. The patterned radiant energy travels through window 71, reflects from fold mirror 72, through refractive elements 76, 78, 80, 82, reflects from mirror 86, travels back through refractive elements 82, 80, 78, 76. The patterned radiant energy further travels through refractive elements 88, 90, 92, 94, reflects from mirror 98 back through refractive elements 94, 92, 90, 88 to fold mirror 100, through window 102 to the substrate 16 where the patterned image 24 is formed if the substrate 16 and apparatus 10 are properly aligned. With a +1X relay such as the embodiment of FIG. 10, the mask and substrate can be locked to move together by the stage controllers 34, 59 and stages 36, 61 and scanned to transfer radiant energy patterned in accordance with the mask pattern to the substrate.

Figure 11:
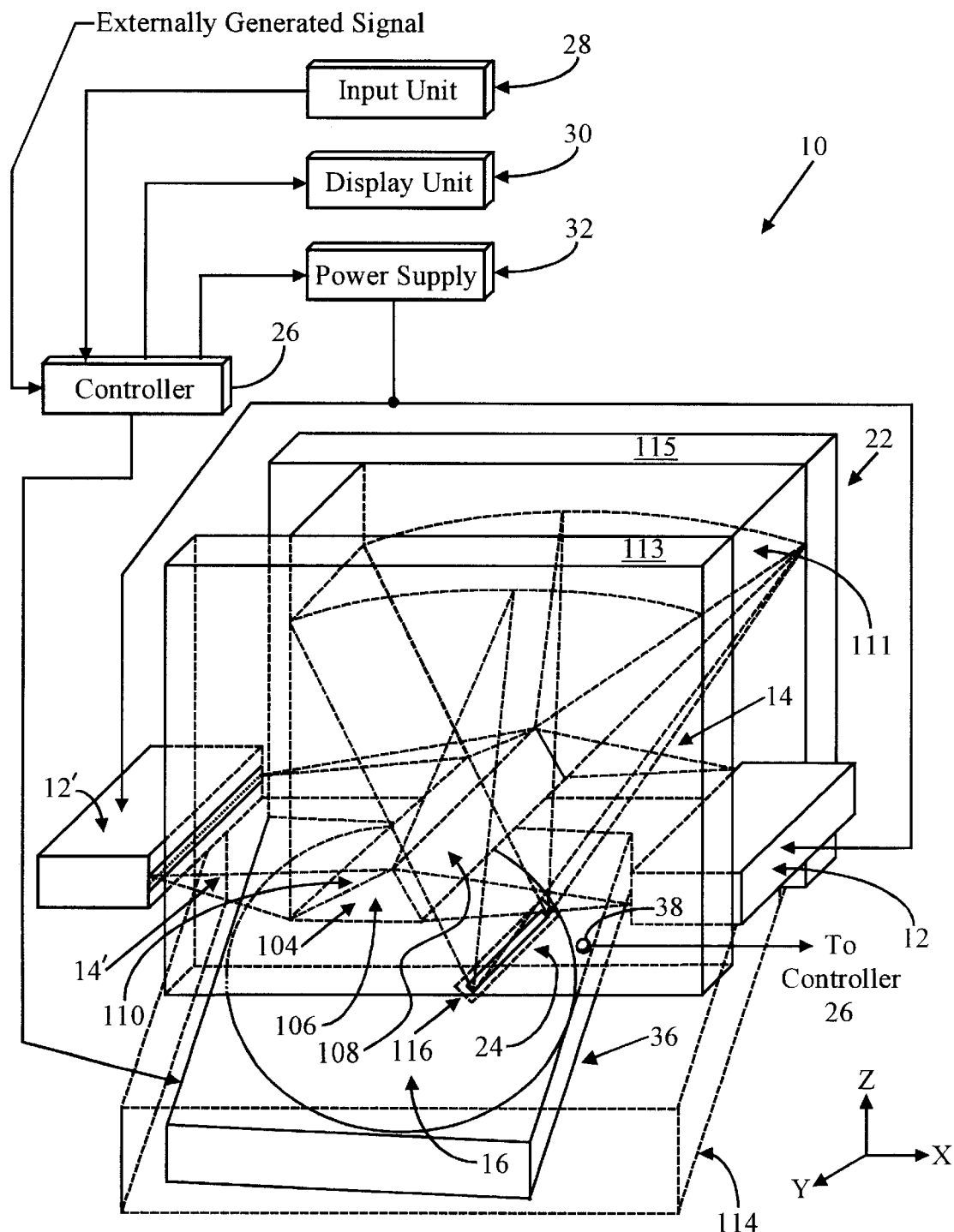
FIG. 11 is a perspective view of a sixth embodiment of the invented apparatus including a catadioptric anamorphic relay with a prism block having two mirrors each of which directs the light from respective line sources so that both line sources may be imaged by the same cylindrical mirror to a common line image on the substrate.

In FIG. 11, the optical relay 22 in the sixth embodiment of the apparatus 10 is catoptric, i.e., all-reflective, non-refractive. The optical relay 22 of FIG. 11 includes a mirror 104 with a base 106 defining intersecting planar reflective surfaces 108, 110. The base 106 includes a rigid material such as glass or plastic, that defines the surfaces 108, 110. The surfaces 108, 110 are made reflective by deposition of reflective material(s) such as aluminum or alternating dielectric layers of different refractive indices on such surfaces. The line source 12 is arranged to direct radiant energy 14 to the reflective surface 108, and the line source 12' is arranged to direct radiant energy 14' to the reflective surface 110. The radiant energy 14, 14' reflected from respective surfaces 108, 110 travels to respective portions of the reflective surface of the curved mirror 111. The radiant energy 14, 14' reflected from the mirror 111 travels to the substrate 16 to form the image 24 thereon. As shown in FIG. 11, the apparatus 10 can include a chamber 114 that is gas-tight to contain the substrate 16 within a predetermined controlled environment. The chamber 114 can also include a window 116 formed of a material transparent to the radiant energy 14, 14', through which the radiant energy is directed to the substrate 16. Such chambers are well-known and commercially-available from numerous sources. For example, the chamber 114 can be used to hold reactant or process gases used to cause a particular reaction to deposit or remove material layers from the substrate 16. The chamber could alternatively be used to form a gas-tight environment that can be filled with inert gas or evacuated to prevent an undesired reaction such as oxidation of the substrate in atmosphere.

Figure 12:
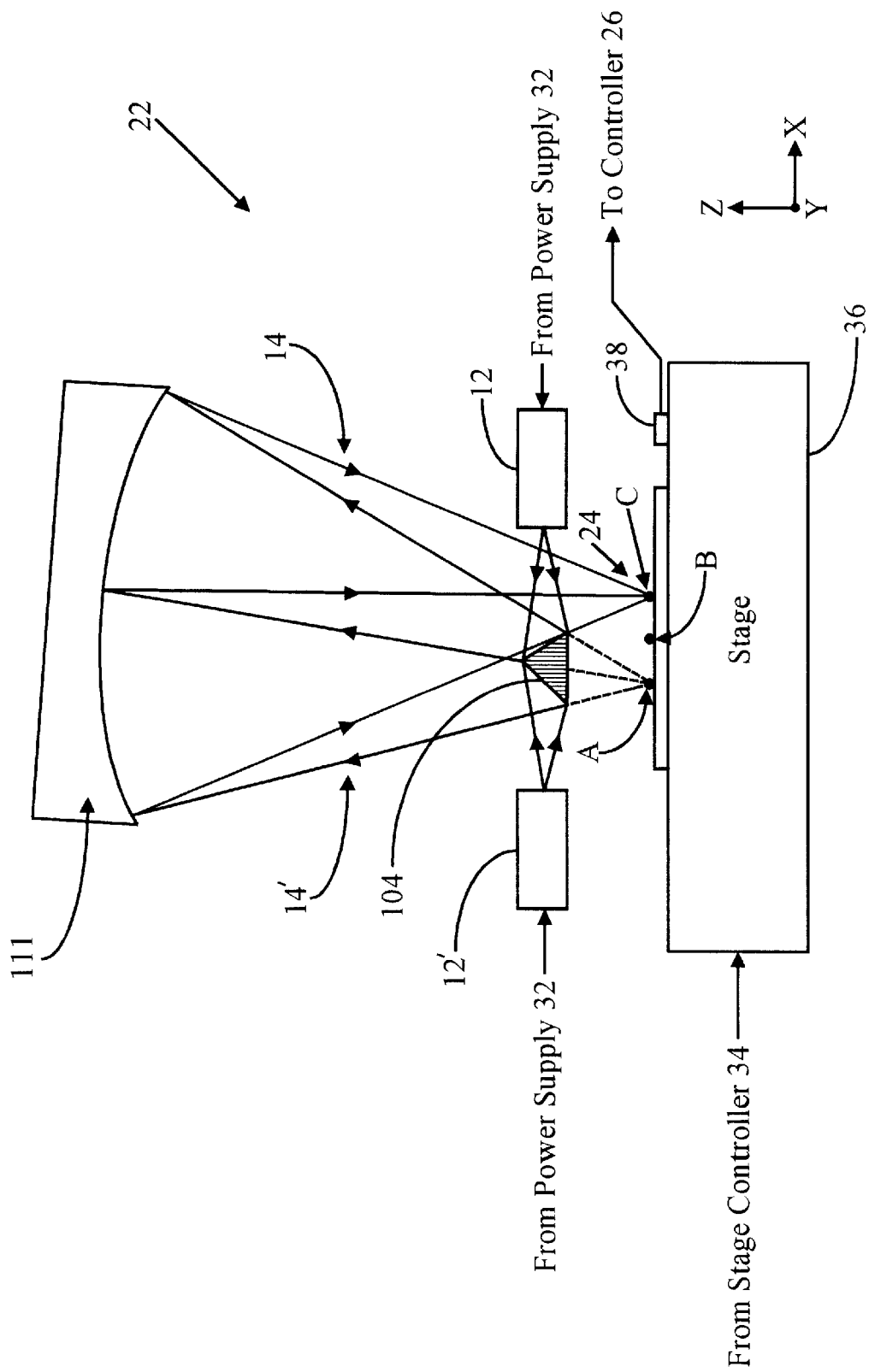
FIG. 12 is a cross-sectional view of the sixth embodiment of the invented apparatus.

FIG. 12 is a cross-sectional view of the line sources 12, 12', the optical relay 22, the substrate 16, and the stage 36 of FIG. 11 shown with the chamber 114 removed. As shown in FIG. 12, the line sources 12, 12', the mirror 104, the curved mirror 111, are positioned so that the virtual object A of the line sources 12, 12' are situated at the same point A in the x-z plane at the surface of the substrate 16. The mirrors, the sources and the substrate are positioned so that the images of the two line sources 12 and 12' are positioned on the substrate 16 at point C. Accordingly, the mirror 111 can be configured with an elliptical reflective surface in the x-z plane with foci at points A and C, and is projected or elongated in the y-axis direction. Alternatively, the mirror 111 can be configured as a circular surface in the x-z plane with center at point B midway between points A and C.

Figure 13:
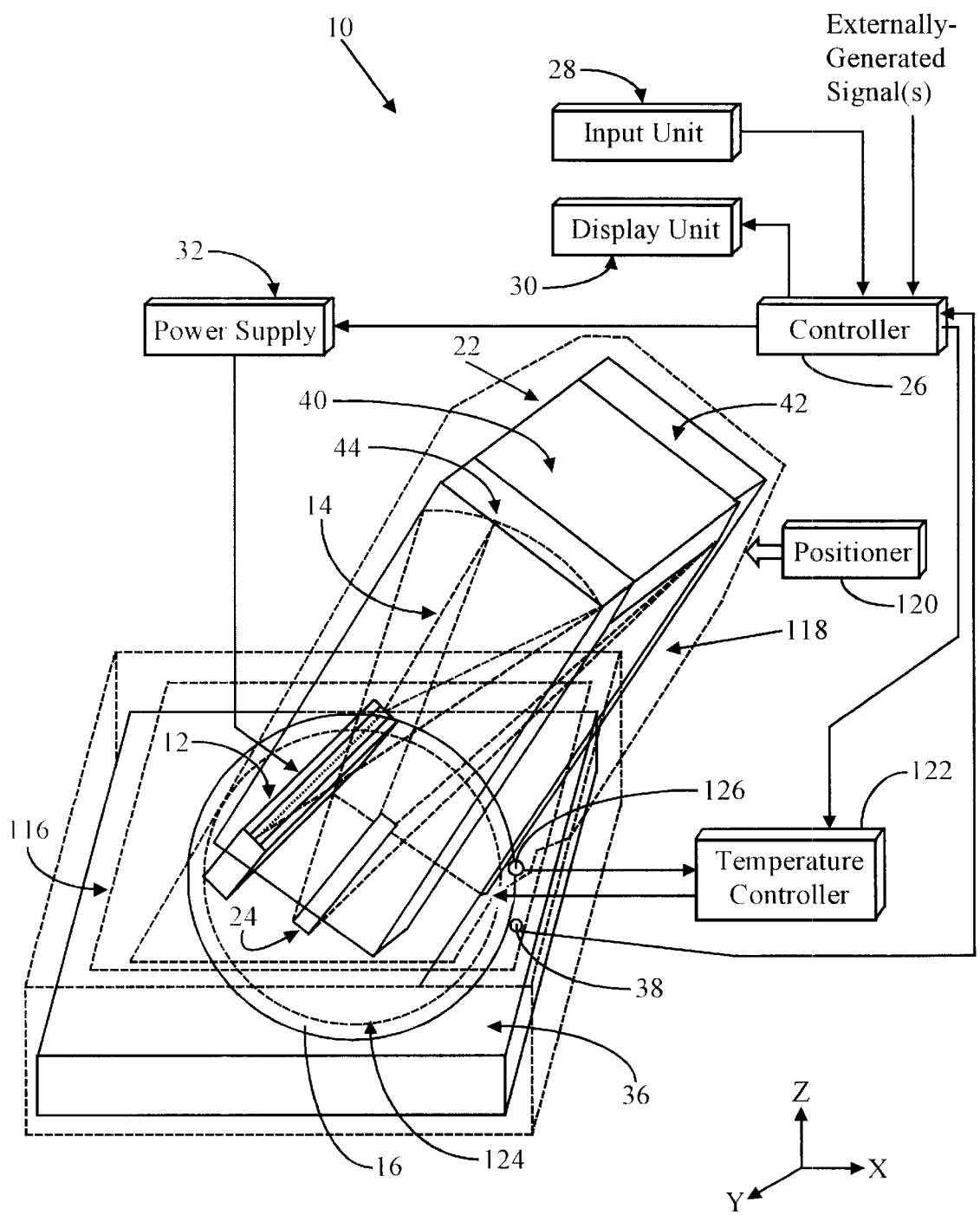
FIG. 13 is a perspective view of a seventh embodiment of the invented apparatus in which the line source and anamorphic optical relay are driven relative to the substrate by a positioner.

FIG. 13 is a seventh embodiment of the apparatus 10 similar to that of FIGS. 2 and 3, in which the line source 12 and the optical relay 22 are housed within a carriage 118, represented schematically, that constitutes a portion of the apparatus' chassis. In FIG. 13, the apparatus 10 includes a positioner 120 coupled to the controller 26 to receive the scan control signal. The positioner 120 can be any one of numerous electromechanical mechanisms capable of moving the line source 12 and the relay 22 relative to the substrate 16. Because the positioner 120 effects the scan of the anamorphic image 24 over the substrate 16, the stage 36 is not required to have the capability to move the substrate 16 relative to line source 12 and the relay 22 over significant distances in the x-y plane. The chamber 114, if used, has a relatively large window 116 to permit the image 24 to be scanned over the substrate 16.

2. Alternative Configurations

As an optional feature, the apparatus 10 can include a temperature controller 122, a heating element 124, and a temperature sensor 126. These elements can be used to elevate the temperature of the substrate before application of radiant energy to the substrate to reduce thermal shock to integrated device or circuit elements formed thereon resulting from application of the radiant energy. The user can manipulate the input unit 28 to generate a parameter signal indicative of a predetermined temperature to which the substrate 16 is to be heated. The controller 26 is coupled to receive this temperature parameter signal. Based on such temperature parameter signal, the controller 26 generates a target temperature signal indicative of the predetermined temperature. The controller 26 is coupled to supply the temperature signal to the temperature controller 122 that generates regulated current based thereon. The temperature controller 122 is coupled to supply the current to the heating element 124 that can be a resistive coil, for example. The temperature sensor 126 is situated in relatively close proximity to the substrate 16. The temperature sensor 126 generates an actual temperature signal and is coupled to supply such signal to the temperature controller 122. Based on the target temperature signal and the actual temperature signal, the temperature controller 122 generates the current signal in a feedback manner to heat and maintain the substrate 16 at the predetermined temperature.

For some applications, the apparatus 10 can include a pulsing capability to generate radiant energy as a single pulse of series of pulses. However, pulsing of a laser diode array(s) can lead to damage or a relatively short useful life. If the pulsing capability is used, parameter signal(s) indicative of predetermined pulse length, pulse strength, and number of pulses can be generated by a user by manipulation of the input unit 28 or received via external signals by the controller 26. In response to the start signal and based on the data signals indicative of the pulse length, pulse strength and number of pulses, the controller 26 can generate the intensity control signal. Based on the intensity control signal, the power supply 32 generates a single or series of current pulses supplied to the line source 12 to generate radiant energy 14 to irradiate the substrate 16.

3. Modes of Operation of the Apparatus

Several operational modes. for the apparatus 10 are possible. In the blanket mode of operation a relatively long, narrow, uniform line image of radiant energy spans the entire width of a substrate and is scanned from one end to the other across the substrate to heat every point thereof. This simplifies the scanning performed by the apparatus but it requires a plurality of laser diode arrays to span a large substrate with sufficient radiant energy intensity. A shorter line image can also be used in combination with multiple scans across the substrate. This requires that the adjacent scans be butted together. For some non-critical applications some overlap between adjacent scans is permissible. However for applications requiring relative exactitude in image placement, adjustable apertures such as element 57 can be placed in the image plane of the anamorphic relay to set the length of the anamorphic image, and an imaging relay such as unit 60 can be used to reimage such delimited image of radiant energy onto the substrate. This permits butted regions to be positioned in the non-critical scribe lines between circuits. In addition, the anamorphic optical relay can be configured to form a line image to a length that is sufficiently large to span the width of a chip or a group of chips on the substrate, a feature that provides the capability to scan the line image over the substrate to process an entire chip or several chips at once.

In the imaging operation mode of operation a mask such as element 58 is contained in the focal plane of the anamorphic optical relay and an imaging relay images the portion of the mask irradiated by the line source(s) onto a substrate. The purpose of the mask is to pattern the light that strikes the substrate so that only the regions on the substrate that require heat treatment are irradiated. The imaging relay that images the mask onto the wafer can be either a one-to-one relay or can magnify or reduce the pattern imaged onto the substrate. In a typical step-and-scan operation using a +1 magnification relay the mask and wafer substrate stage are aligned relative to one another, and coupled together in a fixed relationship so that they can be scanned with respect to the anamorphic relay and line source(s). If the magnification ratio is not +1 then the mask and substrate have to be scanned synchronously at different speeds, requiring a movable stage 59 for the mask that is coupled to receive a signal from the controller that is proportional to the scan control signal supplied to the stage 36 used to position the substrate. If the image is inverted the scanning directions of the substrate and mask are opposed. Alternatively, provided the field size of the relay is large enough, the mask, substrate and relay can be held fixed and the line sources and anamorphic relay can be scanned via a positioner that is basically an electromechanical actuator such as that of FIG. 13. A third possibility is to hold the mask and substrate stationary via the chassis, for example, and to scan the imaging relay and the line source(s) and anamorphic relay relative to the mask and substrate. This function can be performed by an element such as the positioner of FIG. 13 coupled to the imaging relay, line source(s), and anamorphic relay. However, the latter two possibilities are not the most preferred configurations. In all cases, after exposure of one area on the substrate, the substrate is stepped and realigned with the mask so that another strip of the substrate can be exposed, and so on. In a typical scanning operation the line image of radiant energy and the field covered by the imaging relay are made to have sufficient width so they span the width of one or more circuits on the substrate. In this way the butt between successive. scans can be arranged to fall in the scribe line between circuits.

The many features and advantages of the present invention are apparent from the detailed specification and thus, it is intended by the appended claims to cover all such features and advantages of the described apparatus which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the claimed invention.

What is claimed is:

1. An apparatus for treating a substrate with radiant energy, the apparatus comprising:
    at least one line source including a plurality of laser diodes, for generating radiant energy; and
    one dimensional imaging relay positioned to receive the radiant energy from the line source of radiant energy, the one dimensional imaging relay configured to direct the radiant energy to form a line image of the line source on the substrate so that each point along the line image receives radiant energy from more than one of the laser diodes.

2. An apparatus as claimed in claim 1, wherein the line source includes at least one laser diode array bar.

3. An apparatus as claimed in claim 1, wherein two or more line sources are imaged by the one dimensional imaging relay onto the substrate so that the line images of the line sources overlap.

4. An apparatus as claimed in claim 1, wherein the one dimensional imaging relay includes a convergent mirror that is elliptical in a cross-sectional plane with foci centered at the line source and the line image, the mirror extended in a direction perpendicular to the cross-sectional plane.

5. An apparatus as claimed in claim 1, wherein the one dimensional imaging relay includes a convergent mirror that is circular in a cross-sectional plane with a center of curvature situated midway between the line source and the line image, the mirror extended in a direction perpendicular to the cross-sectional plane.

6. An apparatus as claimed in claim 1, wherein:
    the apparatus includes first and second line sources; and
    the one dimensional imaging relay includes:
        first and second convergent mirrors; and
        first and second planar side wall mirrors positioned on opposite sides of the first and second curved mirrors, and normal to the length axis of the line source;
        the first and second convergent mirrors and the first and second planar mirrors receiving radiant energy from the first and second line sources and directing such radiant energy to form line images in close proximity to one another on the substrate.

7. An apparatus as claimed in claim 6, wherein the line images are superimposed.

8. An apparatus as claimed in claim 6, wherein the line images are positioned side-by-side and spaced apart by less than five millimeters.

9. An apparatus as claimed in claim 6, wherein the one dimensional imaging relay further includes first and second fold mirrors permitting the first and second line sources to be positioned at respective positions that are relatively distant from the substrate.

10. An apparatus as claimed in claim 9, further comprising:
    a radiant energy detector positioned on the stage and generating a signal, if scanned across the line image, the controller coupled to receive the detector signal, the controller integrating and scaling the detector signal to generate a signal indicative of the radiant energy dose received at the detector, the controller comparing the level of the signal indicative of the radiant energy dose received at the detector with a predetermined radiant energy dose prestored in the controller to determine whether the radiant energy dose at the substrate is the same as the predetermined radiant energy to be applied to the substrate.

11. An apparatus as claimed in claim 1, wherein:

the apparatus includes first and second line sources; and the one dimensional imaging relay includes:

a first mirror prism positioned to receive radiant energy from the first and second line sources, the first mirror prism having first and second reflective surfaces, the first reflective surface of the mirror prism receiving and reflecting radiant energy from the first line source, and the second reflective surface of the mirror prism receiving and reflecting radiant energy from the second line source;

a convergent mirror receiving radiant energy reflected from the first and second surfaces of the mirror prism and directing the radiant energy to form a linear image on the substrate; and third and fourth planar side wall mirrors positioned on opposite sides of the first and second mirrors and normal to the length axis of the line source, for constraining radiant energy within the space defined between the third and fourth side wall mirrors.

12. An apparatus as claimed in claim 1, wherein the apparatus is coupled to receive a first parameter signal indicative of the predetermined intensity of light to be generated by laser diode array(s), a second parameter signal indicative of the scan speed used to scan the one dimensional image over the substrate, and a third parameter signal indicative of the number of scans to be performed by the apparatus to achieve a predetermined dose of radiant energy at the substrate, and a start signal, the apparatus further comprising:

a controller coupled to receive the parameter signals and the start signal, the controller generating an intensity control signal, based on the first parameter signal, and the controller generating a scan control signal, based on the second and third parameter signals, the controller generating the intensity control signal and the scan control signal in response to the start signal;

a power supply coupled to receive the intensity control signal from the controller, and generating an electric current based on the intensity control signal, supplied to the line source, the line source generating radiant energy based on the current;

a stage controller coupled to receive the scan control signal, and generating a scan signal based on the scan control signal and predetermined scan pattern data prestored in the stage controller; and a stage supporting the substrate, and coupled to receive the scan signal, the stage moving the substrate relative to the line source and one dimensional imaging relay, based on the scan signal.

13. An apparatus as claimed in claim 1, further comprising:

a mask positioned to receive radiant energy from the one dimensional imaging relay; and an optical imaging relay positioned between the mask and the substrate, to image the mask on the substrate.

14. An apparatus as claimed in claim 1, wherein the apparatus is coupled to receive a first parameter signal indicative of the predetermined intensity of light to be generated by laser diode array(s), a second parameter signal indicative of the scan speed used to scan the line image over the substrate, and a third parameter signal indicative of the number of scans to be performed by the apparatus to achieve a predetermined dose of radiant energy at the substrate, and a start signal, the apparatus further comprising:

a controller coupled to receive the parameter signals and the start signal, the controller generating an intensity control signal, based on the first parameter signal, and the controller generating a scan control signal, based on the second and third parameter signals, the controller generating the intensity control signal and the scan control signal in response to the start signal;

a power supply coupled to receive the intensity control signal from the controller, and generating an electric current based on the intensity control signal, the power supply coupled to supply the current to the line source, the line source generating radiant energy based on the current;

a stage controller coupled to receive the scan control signal, and generating a scan signal indicative of the scan speed of the line image over the substrate, based on the scan control signal and predetermined scan pattern data prestored in the stage controller;

a stage for supporting the substrate in a predetermined fixed position;

a carriage supporting the line source and the one dimensional imaging relay in a fixed positional relationship; and a positioner coupled to receive the scan control signal, and coupled to move the carriage relative to the substrate, based on the scan control signal and predetermined scan pattern data prestored in the positioner.

15. An apparatus as claimed in claim 14, further comprising:

a radiant energy detector positioned on the stage and generating a detector signal, if the line image is scanned across the detector, the controller coupled to receive the detector signal, the controller integrating and scaling the detector signal to generate a signal indicative of the radiant energy dose received at the detector, the controller comparing the level of the signal indicative of the radiant energy dose received at the detector with a predetermined radiant energy dose prestored in the controller to determine whether the radiant energy dose at the substrate is the same as the predetermined radiant energy to be applied to the substrate.

16. An apparatus as claimed in claim 1, wherein the apparatus is coupled to receive a first parameter signal indicative of the predetermined intensity of light to be generated by laser diode array(s), a second parameter signal indicative of the scan speed used to scan the one dimensional image over the substrate, and a third parameter signal indicative of the number of scans to be performed by the apparatus to achieve a predetermined dose of radiant energy at the substrate, and a start signal, the apparatus further comprising:

a controller coupled to receive the parameter signal and the start signal, the controller generating an intensity control signal, based on the first parameter signal, and the controller generating a scan control signal, based on the second and third parameter signals, the controller generating the intensity control signal and the scan control signal in response to the start signal;

a power supply coupled to receive the intensity control signal from the controller, and generating an electric current based on the intensity control signal, the power supply coupled to supply the current to the line source, the line source generating radiant energy based on the current;

a stage controller coupled to receive the scan control signal, and generating a scan signal based on the scan control signal and predetermined scan pattern data prestored in the stage controller; and a stage supporting the substrate, and coupled to receive the scan signal, the stage moving the substrate relative to the line source and one dimensional imaging relay, based on the scan signal.

17. An apparatus as claimed in claim 16, further comprising:

a radiant energy detector positioned on the stage and generating a detector signal, if scanned across the line image, the controller coupled to receive the detector signal, the controller integrating and scaling the detector signal to generate a signal indicative of the radiant energy dose received at the detector, the controller comparing the level of the signal indicative of the radiant energy dose received at the detector with a predetermined radiant energy dose prestored in the controller to determine whether the radiant energy dose at the substrate is the same as the predetermined radiant energy to be applied to the substrate.

18. A apparatus as claimed in claim 1, wherein the apparatus is coupled to receive a first parameter signal indicative of the predetermined intensity of light to be generated by laser diode array(s), a second parameter signal indicative of the scan speed used to scan the line image over the substrate, and a third parameter signal indicative of the number of scans to be performed by the apparatus to achieve a predetermined dose of radiant energy at the substrate, and a start signal, the apparatus further comprising:

a controller coupled to receive the data signal and the start signal, the controller generating an intensity control signal, based on the first parameter signal, and the controller generating a scan control signal, based on the second and third parameter signals, the controller generating the intensity control signal and the scan control signal in response to the start signal;

a power supply coupled to receive the intensity control signal from the controller, and generating an electric current based on the intensity control signal, the power supply coupled to supply the current to the line source, the line source generating radiant energy based on the current;

a stage for supporting the substrate in a predetermined fixed position;

a carriage supporting the line source and the one dimensional imaging relay in a fixed positional relationship; and a positioner coupled to receive the scan control signal, and coupled to move the carriage relative to the substrate, based on the scan control signal and predetermined scan pattern data prestored in the positioner.

19. An apparatus as claimed in claim 18, further comprising:

a radiant energy detector positioned on the stage and generating a detector signal, if scanned across the line image, the controller coupled to receive the detector signal, the controller integrating and scaling the detector signal to generate a signal indicative of the radiant energy dose received at the detector, the controller comparing the level of the signal indicative of the radiant energy dose received at the detector with a predetermined radiant energy dose prestored in the controller to determine whether the radiant energy dose at the substrate is the same as the predetermined radiant energy dose to be applied to the substrate.

20. An apparatus as claimed in claim 1, further comprising:

a heating element positioned in close proximity to the substrate, the heating element capable of heating the substrate, based on electric current;

a temperature sensor positioned in close proximity to the substrate, the temperature sensor sensing a temperature of the substrate and generating a signal indicative thereof; and a temperature controller coupled to receive the temperature signal from the temperature sensor and coupled to supply the electric current to the heating element, the temperature controller generating electric current supplied to the heating element, based on predetermined target temperature data and the temperature signal from the temperature sensor.

21. An apparatus as claimed in claim 1, further comprising:

a chamber enclosing the substrate in a predetermined environment, the chamber having a window through which the radiant energy travels from the convergent mirror into the chamber to form the line image on the substrate with the radiant energy.

22. An apparatus as claimed in claim 1, further comprising a chassis in which the line source and one dimensional imaging relay are mounted for support.

23. An apparatus as claimed in claim 1, wherein the substrate is a semiconductor substrate.

24. An apparatus as claimed in claim 1, further comprising at least one delimiter aperture positioned in the image plane of the one dimensional imaging relay, to adjust the length of the line image on the substrate.

25. An apparatus as claimed in claim 24, further comprising:

an imaging relay to image the delimited line image onto the substrate.

26. An apparatus as claimed in claim 1, further comprising;

a mask located at a focal plane of the one dimensional imaging relay;

an imaging relay to image the mask onto a substrate; and stages for scanning the mask and substrate relative to the line image and the one dimensional imaging relay to transfer the mask pattern onto the substrate.

27. An apparatus as claimed in claim 1, further comprising;

a mask located in the focal plane of the one dimensional imaging relay;

a +1X optical imaging relay positionally fixed with respect to the line image; and a scanning unit that scans or incrementally moves the mask and substrate relative to the line source and +1X optical imaging relay to transfer the mask pattern to the substrate.

* * * * *